(12) United States Patent
Jin et al.

(10) Patent No.: US 8,884,679 B2
(45) Date of Patent: Nov. 11, 2014

(54) APPARATUS AND METHOD FOR HIGH VOLTAGE SWITCHES

(75) Inventors: Darmin Jin, Fremont, CA (US);
William Chau, San Jose, CA (US);
Brian Cheung, San Bruno, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/468,957

(22) Filed: May 10, 2012

(65) Prior Publication Data
US 2013/0300485 A1 Nov. 14, 2013

(51) Int. Cl.
*H03L 5/00* (2006.01)

(52) U.S. Cl.
USPC ................... 327/333; 326/61; 326/81

(58) Field of Classification Search
USPC ............. 326/62–63, 80–82; 327/306, 333
See application file for complete search history.

(56) References Cited

U.S. PATENT DOCUMENTS

| | | | |
|---|---|---|---|
| 5,121,007 A * | 6/1992 | Aizaki | 327/544 |
| 5,933,386 A | 8/1999 | Walker et al. | |
| 6,433,582 B2 * | 8/2002 | Hirano | 326/68 |
| 6,795,328 B2 * | 9/2004 | Kato et al. | 365/63 |
| 7,230,475 B2 * | 6/2007 | Choi et al. | 327/544 |
| 7,653,888 B2 | 1/2010 | Habib et al. | |
| 7,881,108 B2 | 2/2011 | Cornwell et al. | |
| 7,928,746 B1 | 4/2011 | Lai et al. | |
| 2002/0093357 A1 | 7/2002 | Montrose | |
| 2002/0145435 A1 | 10/2002 | Bald et al. | |
| 2005/0280461 A1 | 12/2005 | Teraishi | |
| 2010/0301818 A1 | 12/2010 | Kim | |
| 2011/0093224 A1 | 4/2011 | Ide et al. | |

OTHER PUBLICATIONS

PCT International Search Report and Written Opinion of the International Search Authority (ISA) issued in International Application No. PCT/US2013/038701, European Patent Office, Sep. 23, 2013.
Khorasani et al., "Low-Power Static and Dynamic High-Voltage CMOS Level-Shifter Circuits", 2008, pp. 1946-1949.

* cited by examiner

*Primary Examiner* — Dinh Le
(74) *Attorney, Agent, or Firm* — Martine Penilla Group, LLP

(57) ABSTRACT

Apparatus and method for coupling high voltages for a semiconductor device via high voltage switches are disclosed. A high voltage switch includes a switch and a level shifter. The switch is defined between a voltage source and a voltage output. An enable line is coupled to a first transistor of the switch. The level shifter includes an input and an output. A characterization line is coupled to the input of the level shifter and the output of the level shifter is coupled to a second transistor of the switch. The level shifter further includes a power rail that is coupled to the switch between the first transistor and the second transistor.

13 Claims, 9 Drawing Sheets

400c

| | EN | CHAR | VPAD | VOUT | Mark |
|---|---|---|---|---|---|
| Normal Operation Mode | H | L | 0~VDDH | 0v (Floating) | Normal Operation |
| Characterization Mode | L | H | 0~5v | 0~5v | Under Test |
| Standby Mode | L | L | 0~5v | 0v (Floating) | Standby No Test |

VDDH: 1.8, 2.5 or 3.3v

FIG. 4C

APPARATUS AND METHOD FOR HIGH VOLTAGE SWITCHES

BACKGROUND

After a plurality of semiconductor chips have been packaged into a device, any voltages applied to the packaged device, including any test voltages, are limited by the normal operation voltage ranges of the device controller that resides inside the packaged device. However, in order to perform semiconductor chip characterization, such as stress tests, a voltage that is higher than the normal operation voltage ranges of the device controller is needed. However, applying such higher test voltages may damage the device or device controller.

Thus, the danger for damage to a device, once packaged, places undue limits on testing. And, if limits of a packaged device are not fully tested, failures may not be discovered until products embodying such devices fail for customers.

It is within this context that the present invention arises.

SUMMARY

Embodiments of the present disclosure provide methods and systems for conducting characterization test for devices under test. It should be appreciated that the present disclosure can be implemented in numerous ways, such as a process, an apparatus, a system, a device or a method on a computer readable medium. Several inventive embodiments of the present disclosure are described below.

In one embodiment, a high voltage switch for a semiconductor device is disclosed. The high voltage switch includes a switch and a level shifter. The switch of the high voltage switch is defined between a voltage source and a voltage output. An enable line is coupled to a first transistor of the switch. The level shifter includes an input and an output. A characterization line is coupled to the input of the level shifter and the output of the level shifter is coupled to a second transistor of the switch. The level shifter further includes a power rail that is coupled to the switch between the first transistor and the second transistor.

In another embodiment, a system for coupling high voltages for a semiconductor device is disclosed. The disclosed system includes a controller having an input pad and an output pad, and a plurality of semiconductor chips. Each of the input pad and the output pad in the controller is coupled to a respective high voltage switch of the controller. Each of the plurality of semiconductor chips has at least one input pad coupled to a high voltage switch of a respective semiconductor chip. A high voltage is communicated from the input pad of the controller to the output pad of the controller via the coupled high voltage switches. The high voltage is further coupled from the output pad of the controller to at least one input pad of a semiconductor chip via the high voltage switch coupled to the at least one input pad of the semiconductor chip.

In yet another embodiment, a method for communicating high voltages for a semiconductor device is disclosed. The disclosed method includes identifying an input pad and an output pad of the first chip of the semiconductor device. Each of the input pad and the output pad is coupled to a respective high voltage switch of the first chip. The identification of the input pad and the output pad of the first chip is set by turning on each of the respective high voltage switches of the first chip. The method further includes identifying at least one input pad of the second chip of the semiconductor device. The at least one input pad of the second chip is coupled to a high voltage switch of the second chip. The identification of the input pad of the second chip is set by turning on the high voltage switch of the second ship. The method also includes communicating a high voltage received from the input pad of the first chip to the output pad of the first chip and communicating the high voltage from the output pad of the first chip to the at least input pad of the second chip. The high voltage is higher than normal operation voltages of the semiconductor device.

Other aspects and advantages of the invention will become more apparent from the following detailed description, taken in conjunction with the accompanying drawings, illustrating by way of example the present invention.

BRIEF DESCRIPTION OF THE DRAWINGS

The disclosure may best be understood by reference to the following description taken in conjunction with the accompanying drawings.

FIG. 4C shows an operation table of a high voltage switch, in accordance with one embodiment of the present invention.

DETAILED DESCRIPTION

Figure 1:
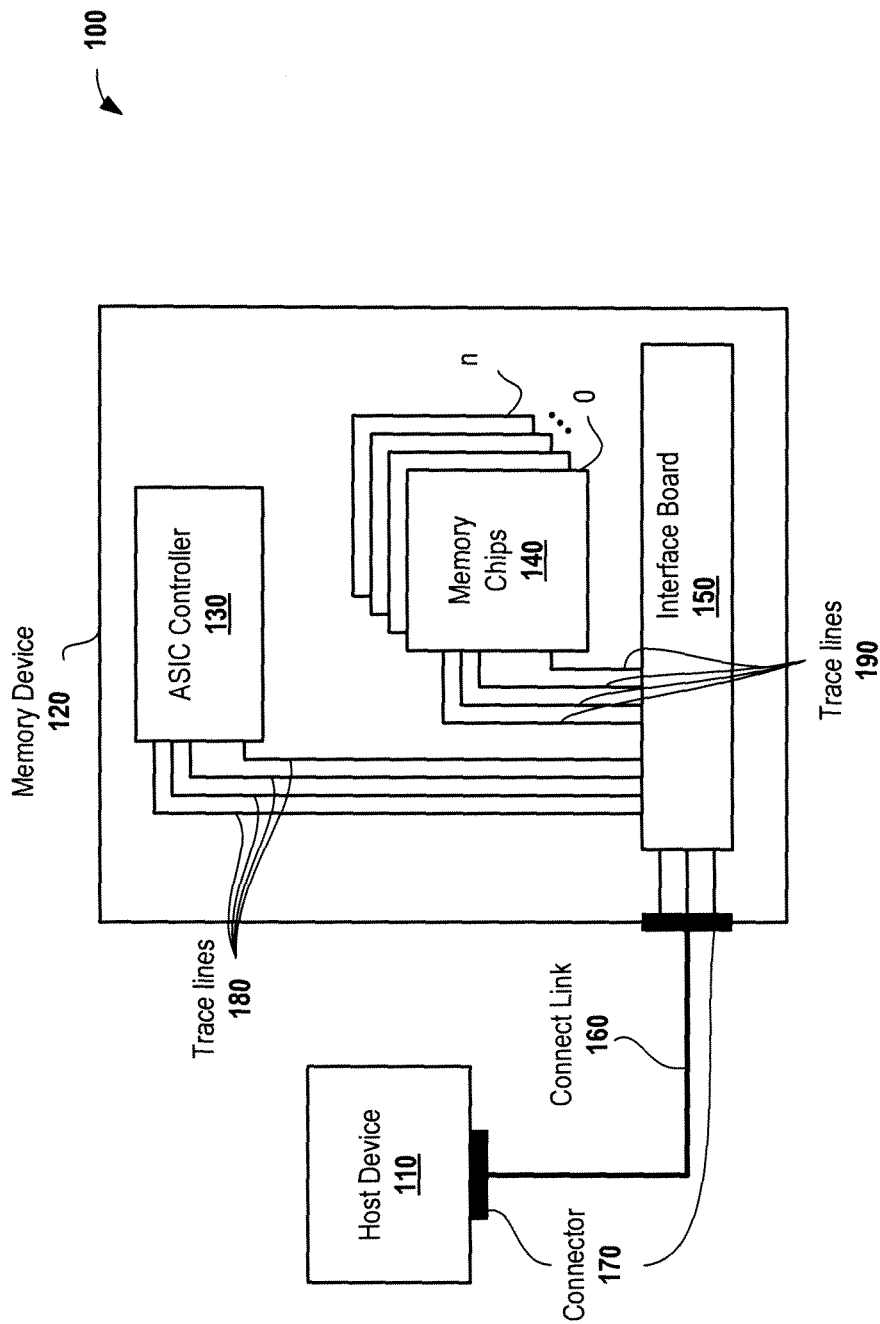
FIG. 1 shows a system with a packaged semiconductor device, in accordance with one embodiment of the present invention.

Embodiments defining circuitry and methods for testing packaged semiconductor devices are disclosed. For completeness, the following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in a simple block diagram format in order to avoid unnecessarily obscuring the present disclosure. Thus, the specific details set forth are merely exemplary. Particular implementations may vary from these exemplary details and still be contemplated to be within the spirit and scope of the present disclosure.

Reference in the description to "one embodiment" or "an embodiment" means that a particular feature, structure, or characteristic described in connection with the embodiment is included in at least one embodiment of the disclosure. The appearances of the phrase "in one embodiment" in various places in the specification do not necessarily all refer to the same embodiment.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

Broadly speaking, apparatus, methods, and circuitry for communicating high voltage tests to a semiconductor device, via high voltage switches, are disclosed. In one embodiment, a high voltage switch includes a switch and a level shifter. The switch is defined between a voltage source and a voltage output. An enable line is coupled to a first transistor of the switch. The level shifter includes an input and an output. A characterization line is coupled to the input of the level shifter and the output of the level shifter is coupled to a second transistor of the switch. The level shifter further includes a power rail that is coupled to the switch between the first transistor and the second transistor.

The disclosed high voltage switch may be coupled to a pad in a semiconductor device. Two control signals ("EN" and "CHAR") may be utilized to control a high voltage switch to turn on and turn off the high voltage switch. The high voltage switch may operate in a normal operation mode, a characterization mode, or a standby mode. A high voltage is a voltage that may be higher than normal operation voltages of the semiconductor device, and may be communicated through one or more chips of a semiconductor device (which may be packaged together). In one embodiment, the high voltage is addressable to specific pads of each chip, and the high voltage is communicated/connected via high voltage switch(es), which operate in the characterization mode.

FIG. 1 shows a system 100 with a packaged semiconductor device, in accordance with one embodiment of the present invention. The system 100 includes a host device 110 and a memory device 120. The memory device 120 is a packaged semiconductor device. The host device 110 and the memory device 120 are connected together via a connect link 160 and connectors 170. Any number of well known connection links and connectors may be used to interface the host device 110 to the memory device 120. The host device 110 can broadly define any device that needs to access memory device 120. For instance, the host device 110 may be a computer, laptop, a tablet, a telephone, a digital camera, a TV set, etc.

The memory device 120 includes an Application-specific Integrated Circuit ("ASIC") controller 130, an interface board 150, and a plurality of memory chips 140 (0 . . . n). The ASIC controller 130 and the plurality of memory chips 140 (0 . . . n) are connected to the interface board 150 via the trace lines 180 and the 190, respectively. Of course, any other typed connections or interconnects will work, so long as electrical connections are made. Thus, ASIC controller 130 communicates with the plurality of memory chips 140 (0 . . . n), via the interface board 150.

Figure 2A:
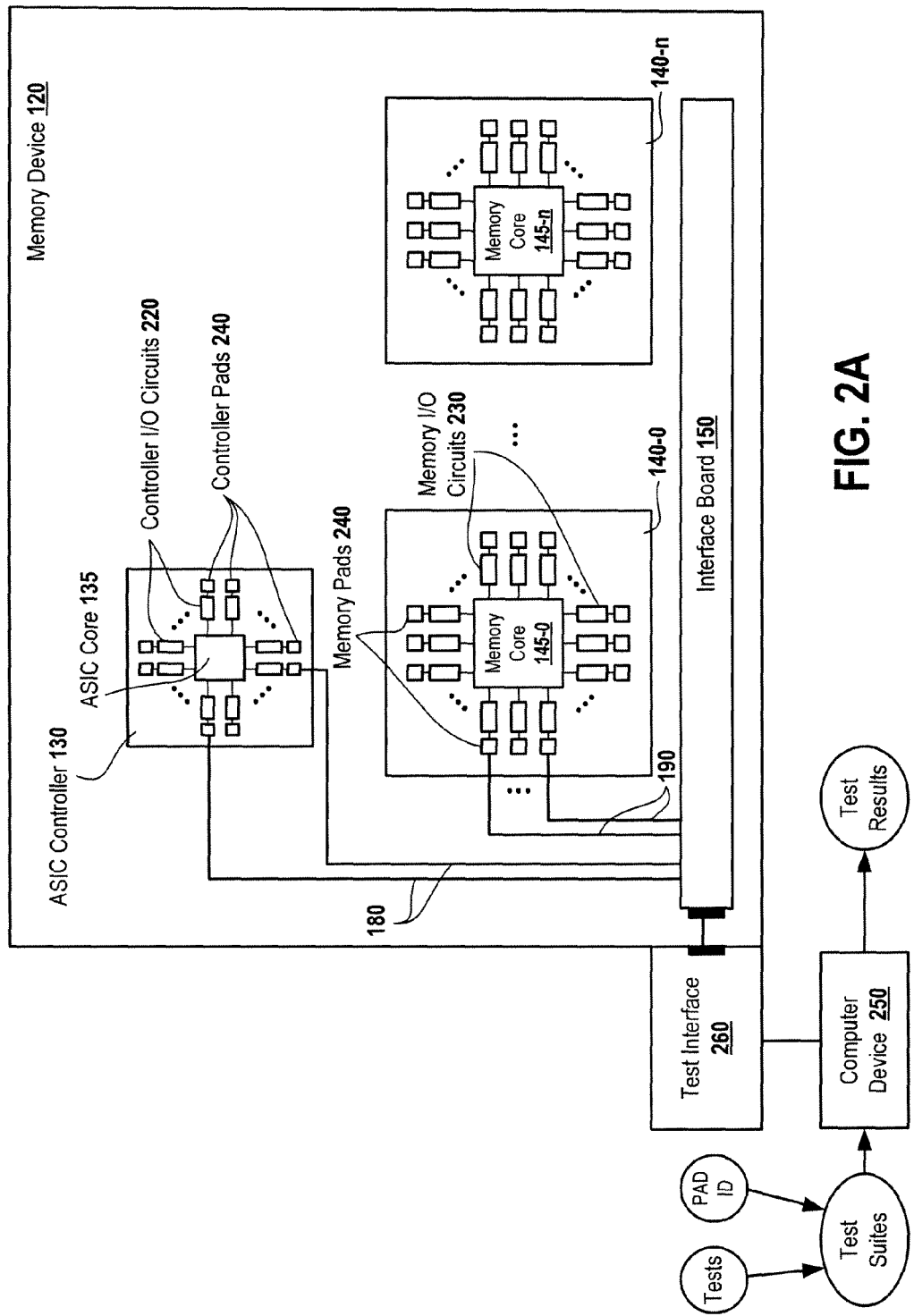
FIG. 2A shows a testing system for a memory device, in accordance with one embodiment of the present invention.

FIG. 2A shows a testing system for testing memory device 120, in accordance with one embodiment of the present invention. As discussed above in respect to FIG. 1, the memory device 120 includes an ASIC controller 130, an interface board 150, and a plurality of memory chips 140 (0 . . . n). The ASIC controller 130 includes an ASIC core 135, a plurality of controller Input/Output ("I/O") circuits 220, and a plurality of controller pads 210. In one embodiment, each of the plurality of controller pads 210 is disposed evenly spaced or distributed along the edge of the ASIC controller 130. In the exampled illustrated in FIG. 2A, each controller pad 210 is coupled to a corresponding controller I/O circuit 220 and a trace wire 180, respectively. The ASIC controller 130, coupled to the interface board 150 via the trace wires 180, communicates with any of the memory chips 140 (0 . . . n) via the interface board 150.

In one embodiment, each memory chip 140 includes a memory core 145, a plurality of memory I/O circuits 230, and a plurality of memory pads 240. The plurality of memory pads 240 may be disposed evenly spaced or distributed along the edge of a memory chip 140. Each memory pad 240 is coupled to a corresponding memory I/O circuit 230. Each memory chip 140, coupled to the interface board 150 via the trace lines 190, may communicate with the ASIC controller 130 via the interface board 150. In one embodiment, each of the controller pads 210 and each of the memory pads 240 are identical.

In one embodiment, a computer device 250 may send test commands to the ASIC controller 130 via the test interface 260 and the interface board 150. As shown in FIG. 2A, the test commands may be part of a test suite received by the computer device 250. In one embodiment, the test commands sent by the computer device 250 may indicate which memory chip needs to be tested. The test commends may further indicate how many and/or which controller/memory pads are to be activated/identified for the tests. In one embodiment, the computer device 250 may receive the test results from the ASIC controller 130 via the interface board 150 and the test interface 260, and sends the test results to other devices.

Figure 2B:
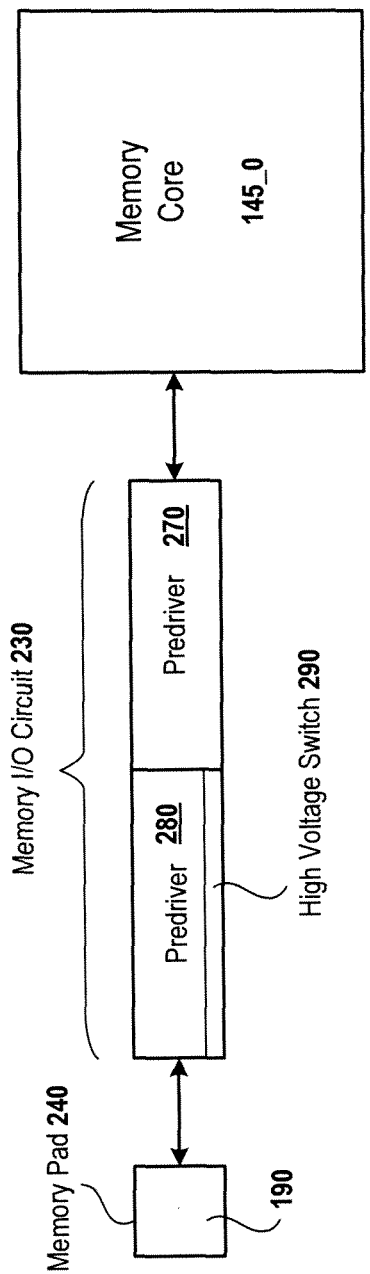
FIG. 2B shows a memory I/O circuit along with a corresponding memory pad for a memory chip, in accordance with one embodiment of the present invention.

FIG. 2B shows a memory I/O circuit 230 along with a memory pad 240 for a memory chip 140_0, in accordance with one embodiment of the present invention. In the example shown in FIG. 2B, the memory I/O circuit 230 is coupled to a corresponding memory pad 240, which in turn is coupled to a trace wire 190. The memory I/O circuit 230 is also coupled to the memory core 145-0. In one embodiment, the memory I/O circuit 230 includes a driver 280 and a pre-driver 270, and a high voltage switch 290, which may be part of the driver 280, or defined as a separate circuit. As is well known, drivers are circuits that provide amplification and/or signal strength. In one embodiment, signals communicated from within the core of a chip to the I/O pads of a chip need to be driven, and drivers provide such a function.

As discussed above, each memory chip 140 includes a plurality of memory I/O circuits 230, and the ASIC controller 130 includes a plurality of controller I/O circuits 220. In one embodiment, a high voltage switch 290 is disposed in each of the plurality of memory I/O circuits 230 and in each of the plurality of controller I/O circuits 220. In another embodiment, a high voltage switch 290 is disposed in selected memory I/O circuits 230 and in selected controller I/O circuits 240. In one embodiment, similar to the memory I/O circuit 230, each of the controller I/O circuits 220 includes a driver portion and a pre-driver portion and each driver portion of the controller I/O circuits 220 includes a high voltage switch 290.

Figure 3A:
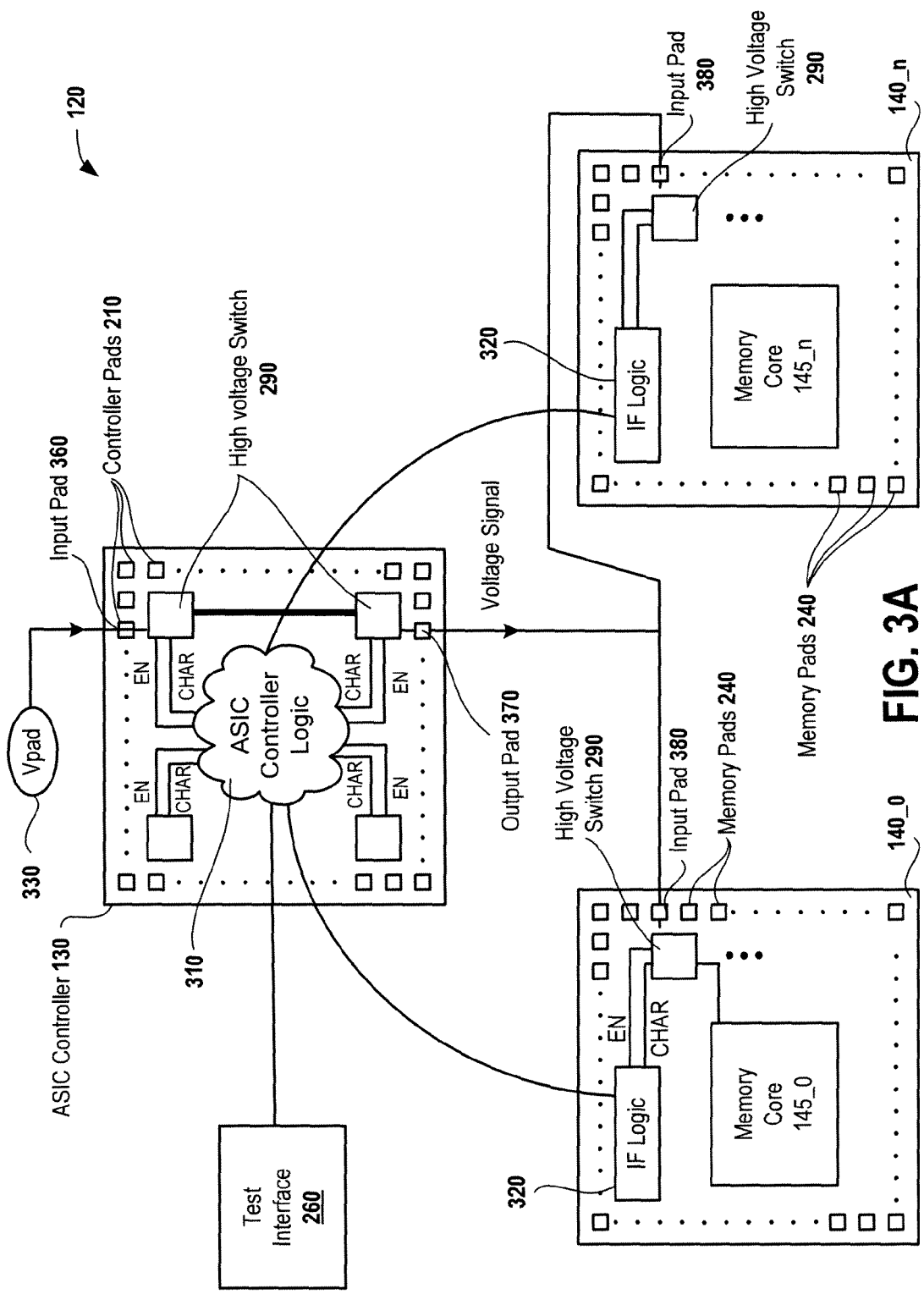
FIG. 3A shows a memory device implemented with high voltage switches, in accordance with one embodiment of the present invention.

FIG. 3A shows a memory device 120 implemented with high voltage switches, in accordance with one embodiment of the present invention. As discussed above, the memory device 120 includes an ASIC controller 130 and a plurality of memory chips 140 (0 . . . n). For the simplicity of illustration, the interface board 150 of the memory device 120 is not shown in FIG. 3A.

In one embodiment, each of the controller pads 210 in the ASIC controller 130 is coupled with a corresponding controller I/O circuit 220, and each of the memory pads 240 is coupled with a corresponding memory I/O circuit 230. Each controller 110 circuit 220 includes a high voltage switch 290, and each memory I/O circuit 230 includes a high voltage switch 290. For the simplicity of illustration, the high voltage switch 290 in each of the memory I/O circuits 230/the controller I/O circuits 220 is shown to be coupled to the a corresponding memory/controller pad, other portions of the controller I/O circuits 220/the memory I/O circuits 230 are not shown in FIG. 3A.

In one embodiment, the memory device 120 may be powered by a voltage source, e.g., Vpad 330. The Vpad 330 may be coupled to all or selected controller pads in the ASIC controller 130 so that voltages may be supplied to the memory device 120 during tests or normal operations. The Vpad 330 may be configured to be capable of operating in voltage ranges that are higher than normal operation voltages of the memory device 120. Each high voltage switch 290 coupled to a controller pad 210 is controlled by the ASIC controller logic 310. In the example illustrated in FIG. 3A, the ASIC controller logic 310 controls each high voltage switch 290 through an "EN" control signal via an enable line and a "CHAR" control signal via a characterization line. The ASIC controller logic 310 may communicate with an external test controller, such as the computer device 250 shown in FIG. 2A, via the test interface 260 to receive test commends and to send out test results.

In one embodiment, during a test procedure, the ASIC controller 130 may communicate a high voltage, e.g., received from the Vpad 330, from an input pad 360 of the ASIC controller 130 to an output pad 370 of the ASIC controller 130 by turning on the high voltage switches respectively coupled to the input pad and the output pad of the ASIC controller 130. The high voltage is a voltage that is higher than normal operation voltages of the ASIC controller 130. Since the high voltage is communicated from the input pad 360 to the output pad 370 without going through the ASIC core 135, the ASIC controller 130 is not damaged during the test procedure. Each of the memory chips 140 may receive the high voltage communicated from the ASIC controller 130 via one or more selected input pads 380 of the memory chip.

In one embodiment, each memory chip 140 includes an Interface ('IF') logic 320 that controls the high voltage switches 290 coupled to corresponding memory pads 240. Similar to the operation of the ASIC controller logic 310, the IF logic 320 (among other operations) may control a high voltage switch 290 of the memory chip via an "EN" control signal from an enable line and a "CHAR" control signal from a characterization line. Each memory chip 140 receives the voltage signal passed from the ASIC controller 130 via a memory pad, which in turn, passes the voltage signal to the memory core 145 via a corresponding high voltage switch 290.

In one embodiment, the ASIC controller logic 310 communicates with each IF logic 320. For example, the ASIC controller may provide instructions to each IF logic 320 to select the memory chip to be tested or to identify at least one input pad in the memory chip by turning on the high voltage switch coupled to the identified input pad of the memory chip. In another example, the ASIC controller may communicate with each IF logic to synchronize the high voltage switch control signals in each memory with the ones in the ASIC controller 130.

Figure 3B:
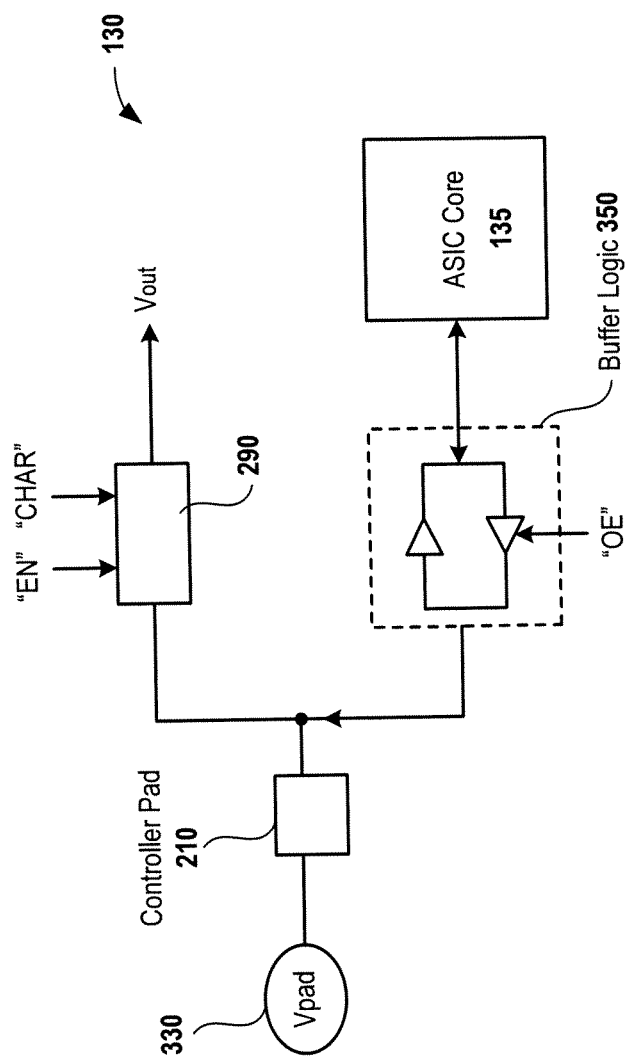
FIG. 3B shows a block diagram of the interconnections for a controller pad in an ASIC controller, in accordance with one embodiment of the present invention.

FIG. 3B shows a block diagram of the interconnections for a controller pad 210 in the ASIC controller 130, in accordance with one embodiment of the present invention. As shown, the controller pad 210 is coupled with a voltage source, e.g., the Vpad 330. In one embodiment, the Vpad 330 may be utilized to supply voltage signals, during both the test procedures and normal operations, to the ASIC controller 130 and the plurality of memory chips 140 in the memory device 120. In one embodiment, the voltage signals supplied by the Vpad 330 during normal operations range from about 0 to 3.3 v and the voltage signals supplied by the Vpad 330 during test procedures range from about 0 to 5V. In one embodiment, during a test procedure, the controller pad 210, from which the test voltage signal is received from the Vpad 330, is considered as the input pad 360, as shown in FIG. 3A.

In one embodiment, a high voltage switch 290 and buffer logic 350 is coupled to the controller pad 210. As discussed above in respect to FIG. 3A, the high voltage switch 290 may be controlled by the "EN" and "CHAR" control signals. The high voltage switch 290 may be configured to be turned on during a test procedure so that the voltage signals supplied by the Vpad 330, including high voltage signals that are higher than normal operation voltages of the ASIC controller 130, may pass through the high voltage switch, instead of the ASIC core 135. In one embodiment, the buffer logic 350 may have other logic or control that would prevent the high voltage from going through the ASIC core 135 during a test procedure.

In one embodiment, during the normal operation, the high voltage switch 290 is configured to be turned off. The normal operation voltage signal of the memory device 120, e.g., supplied by the Vpad 330, is passed to the ASIC Core 135 via the controller pad 210 and the buffer logic 350. The buffer logic control signal "OE" may be utilized to enable the pass of the output from the ASIC core 135 to the controller pad 210.

Figure 4A:
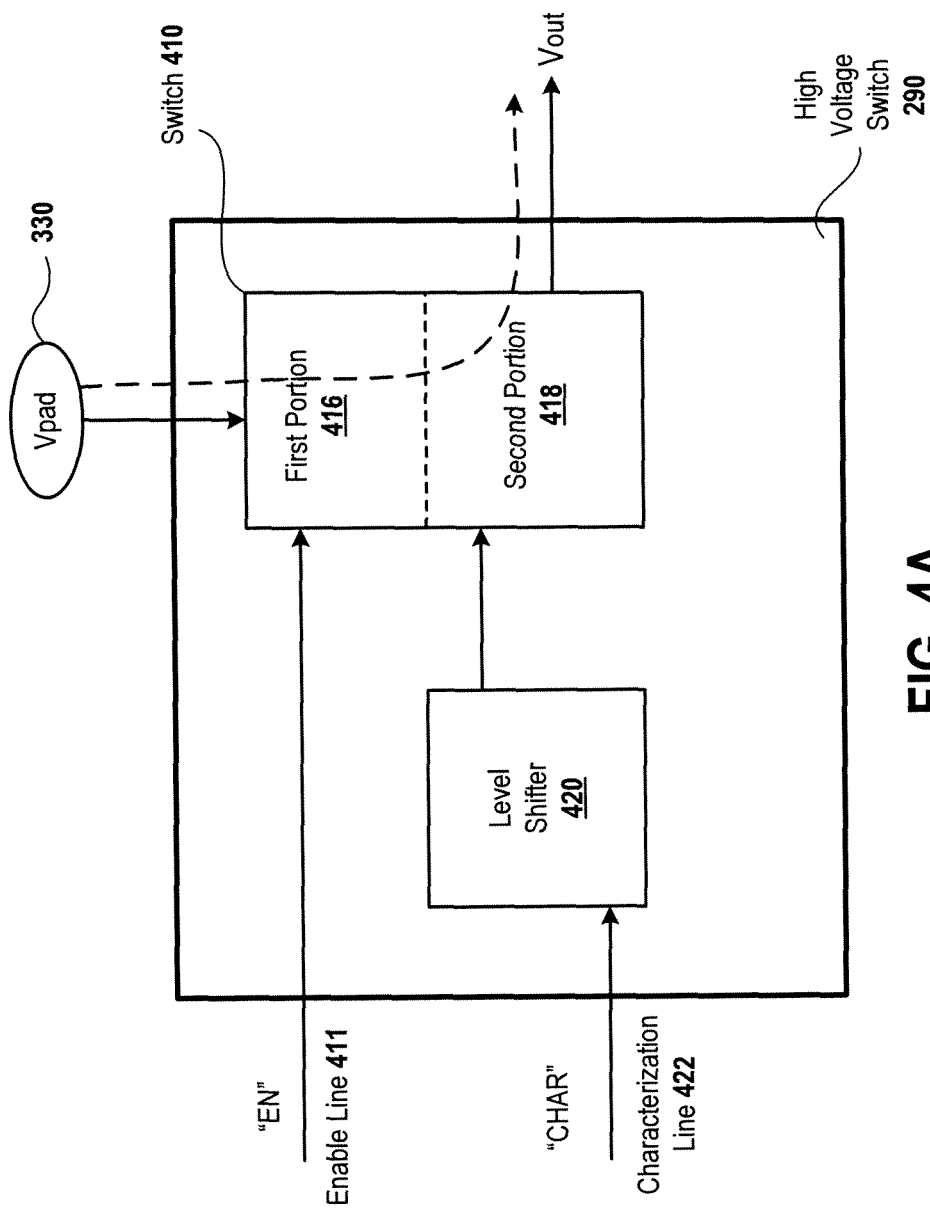
FIG. 4A shows a block diagram of a high voltage switch, in accordance with one embodiment of the present invention.

FIG. 4A shows a block diagram of a high voltage switch 290, in accordance with one embodiment of the present invention. The high voltage switch 290 includes a switch 410 and a level shifter 420. The switch 410 includes a first portion 416 and a second portion 418. The first portion 416 of the switch 410 is controlled by the "EN" control signal via an enable line 411 and the second portion 418 of the switch 410 is controlled by the output of the level shifter 420, which, in turn, is controlled by the "CHAR" control signal via a characterization line 422. A voltage source Vpad 330 is coupled to the switch 410. When both the first portion 416 and the second portion 418 of the switch 410 are turned on, the voltage signal from the Vpad 330 may go through the switch 410 (as indicated by the dash line) to generate the voltage output Vout.

Figure 4B:
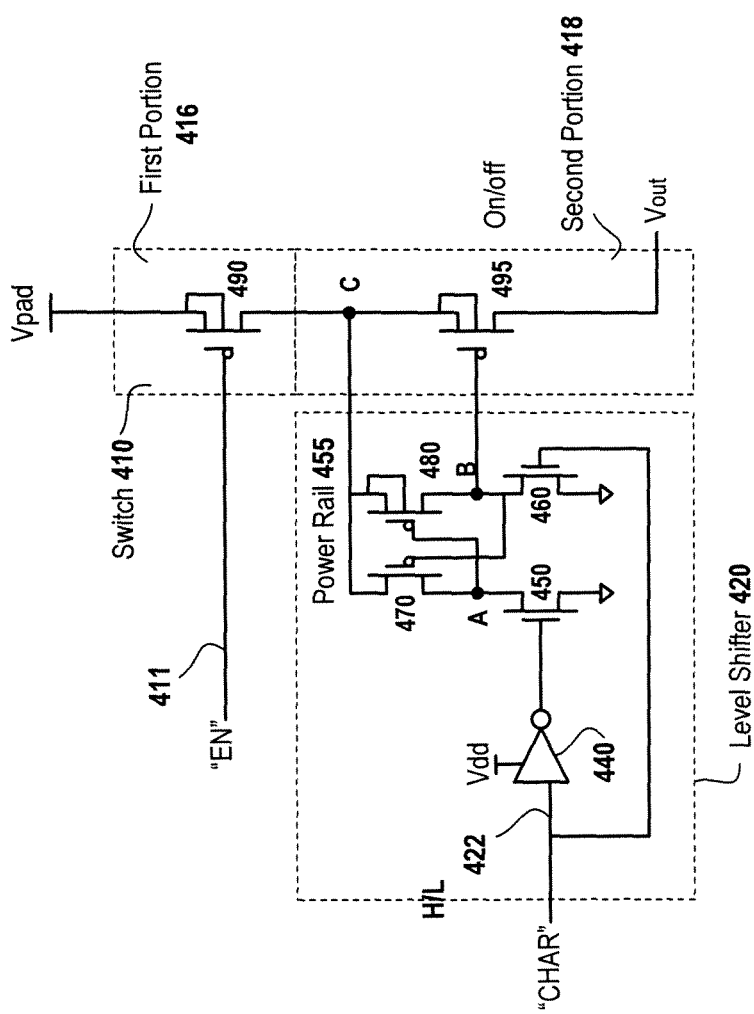
FIG. 4B shows a circuit diagram of a high voltage switch, in accordance with one embodiment of the present invention.

FIG. 4B shows a circuit diagram of the high voltage switch 290, in accordance with one embodiment of the present invention. The level shifter 420 is coupled to the switch 410 via node B and node C.

As shown, the level shifter 420 includes an inverter 440, two NMOS transistors 450 and 460, and two PMOS transistors 470 and 480. The inverter 440 is coupled to a voltage source Vdd. In one embodiment, the voltage source Vdd is about 1.2V. The inverter 440 receives an input from the characterization line 422 and generates an output that is coupled to the gate of the NMOS transistor 450. The characterization line 422 is further coupled to the gate of the NMOS transistor 460. The two PMOS transistors 470 and 480 act as a swing-restoring load. The sources of the two PMOS transistors 470 and 480 are coupled to the node C via the power rail 455. The drains of the two PMOS transistors 470 and 480 are coupled to the drains of the two NMOS transistors 450 and 460 at node A and node B, respectively. The drain of the NMOS transistor 450 is cross-coupled to the gate of the PMOS transistor 480, and the drain of the NMOS transistor 460 is crossly coupled to the gate of the PMOS transistor 470.

The switch 410 includes two PMOS transistors 490 and 495 that are connected in series. The source terminal of the PMOS transistor 490 is coupled to the voltage source (Vpad 330) and the drain terminal of the PMOS 495 is coupled to the voltage output Vout. The enable line 411 is coupled to the gate of the PMOS transistor 490 and the output of the level shifter 420 is coupled to the gate of the PMOS transistor 495. The drain of the PMOS transistor 490 is coupled to the source of the PMOS transistor 495 at node C that in turn, is coupled to the power rail 455 of the level shifter 420. In one embodiment, the control signals "CHAR" and "EN" may be either "H" or "L."

FIG. 4C shows an operation table 400C of the high voltage switch 290, in accordance with one embodiment of the present invention. The operation table 400C will be described in conjunction with the circuit diagram of the high voltage switch 290 shown in FIG. 4B. During the normal operation mode and the standby mode, the high voltage switch 290 is turned off. During the characterization mode, the high voltage switch is turned on to pass through the received voltage signal.

When the high voltage switch 290 operates in the normal operation mode, the control signal "EN" is "H" and the control signal "CHAR" is "L." As used herein, "L" means low and "H" means high. Because the control signal "CHAR" is "L," the NMOS transistor 450 is turned on and provides a conducting path to ground, while the NMOS transistor 460 is cut off. Therefore, node A in the level shifter 420 is pulled down to ground, which turns on the PMOS transistor 480. Because the control signal "EN" is "H," the PMOS transistor 490 is turned off. The drain of the PMOS transistor 490 is floating at a very low voltage, e.g., 0.01V. Also, because the NMOS transistor 460 is off, the output of the level shifter 420 at node B is floating at a very low voltage as well. The low voltages at both the gate and the source of the PMOS transistor 495 turn off the PMOS transistor 495. As a result, the Vout of the high voltage switch 290 is about 0V (in a floating state). As discussed above, during the normal operation mode, the Vpad may be utilized to supply voltage signals to the semiconductor device where the high voltage switch is disposed. In one embodiment, the normal operation voltage ranges from 0 to 3.3V.

When the high voltage switch operates in the characterization mode, the control signal "CHAR" is "H" and the control signal "EN" is "L." Thus, the PMOS transistor 470 and the NMOS transistor 460 in the level shifter 420 are on. The PMOS transistor 490 in the switch 410 is turned on due to the fact that the control signal "EN" is "L." As a result, the voltage signal from the Vpad passes through the PMOS transistor 490 and node C is pulled up. Because the NMOS transistor 460 is turned on and provides a conducting path to ground, node B is pulled down to the ground. Consequently, the PMOS transistor 495 is turned on, and Vout is about the same as the voltage signal provided by the Vpad, e.g., 0 to 5V.

When the high voltage switch operates in the standby mode, both control signals "EN" and "CHAR" are "L." The standby mode for a particular pad to which the high voltage switch is coupled to is used when the semiconductor device, such as memory device 120, is under test through other pads, i.e., not this particular pad. The NMOS transistor 450 and the PMOS transistor 480 in the level shifter 420 are on. Because the PMOS transistor 490 in the switch 410 is turned on due to the low control signal in "EN," node C is pulled up. Thus, node B is pulled up because the PMOS transistor 480 is on. As a result, the PMOS transistor 495 in the switch 410 is turned off. Therefore, Vout is about 0V in a floating state.

Figure 5:
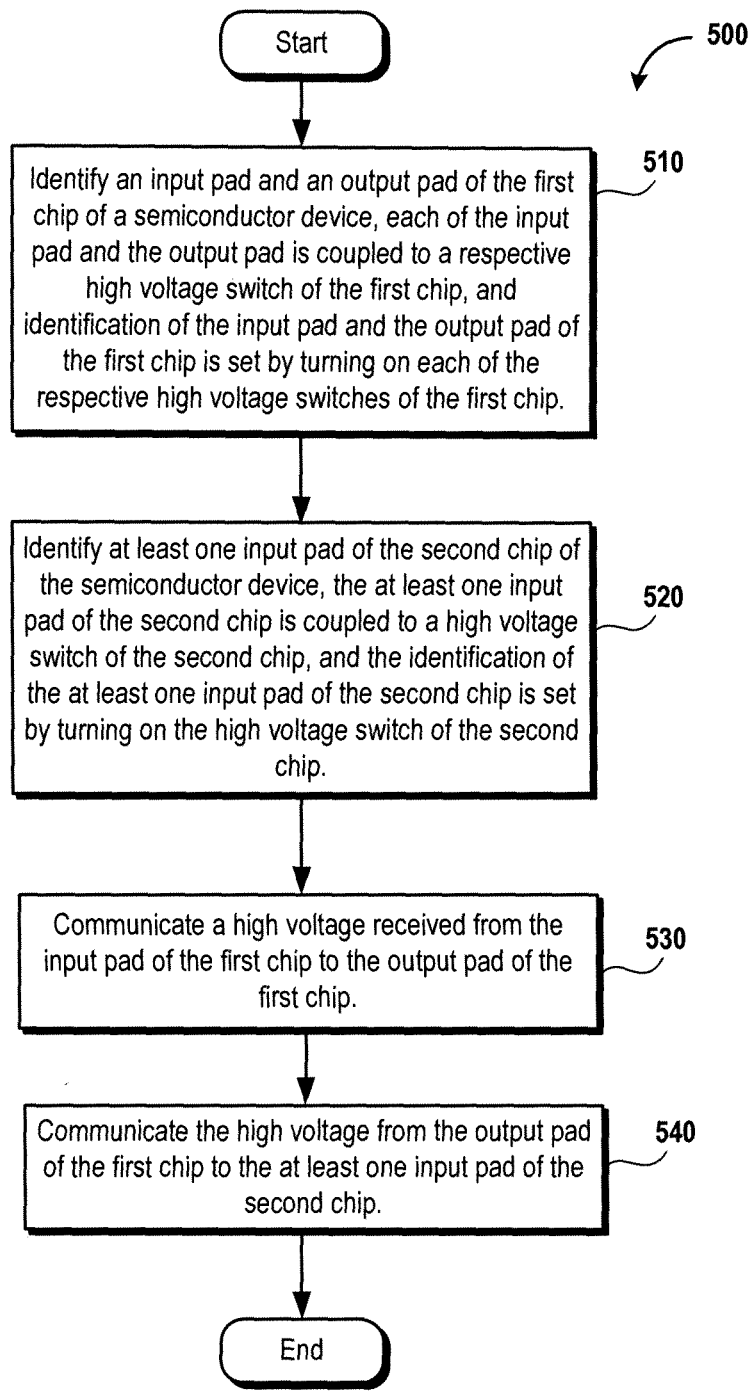
FIG. 5 illustrates a flow diagram of an exemplary method for communicating high voltages for a semiconductor device via high voltage switches, in accordance with one embodiment of the present disclosure.

FIG. 5 illustrates a flow diagram of an exemplary method 500 for communicating high voltages for a semiconductor device via high voltage switches, in accordance with one embodiment of the present disclosure. In one embodiment, the illustrated exemplary method 500 is described in relation to the memory device 120 and the high voltage switch 290, as shown in FIGS. 3A and 4A, and to the operation table 400C shown in FIG. 4C. In this embodiment, the high voltage switches are operated in the characterization mode. In this embodiment, the semiconductor device includes a first chip and a second chip. In one embodiment, the semiconductor device is the memory device 120 shown in FIG. 3A, the first chip is the ASIC controller 130, and the second chip is one of the memory chips 140.

In operation 510, the input pad and the output pad for the first chip are identified. Each of the input pad and the output pad is coupled to a respective high voltage switch of the first chip. The identification of the input pad and the output pad of the first chip is set by turning on the high voltage switches respectively coupled to the input pad and the output pad.

In one embodiment, the input pad is coupled to a voltage source for receiving an input voltage signal and the output pad may be utilized to generate an output voltage signal. The voltage source is capable of providing a voltage signal that is higher than the normal operation voltage of the semiconductor device. In one embodiment, both the input voltage signal and the output voltage signal are higher than normal operation voltages of the semiconductor device.

In operation 520, at least one input pad of the second chip is identified by turning on the high voltage switch coupled to the at least one input pad of the second chip. The input pad of the second chip may be used to receive the output voltage signal from the output pad of the first chip.

In operation 530, the high voltage received from the input pad of the first chip is communicated to the output pad of the first chip. In one embodiment, the high voltage is received from the voltage source, such as Vpad 330, coupled to the input pad of the first chip. The high voltage is a voltage that is higher than normal operation voltages of the first chip.

In operation 540, the high voltages from the output pad of the first chip is communicated to the at least one input pad of the second chip.

In one embodiment, each of the high voltage switches of the first chip and the second chip includes a switch and a level shifter. Each high voltage switch is turned on by setting the enable line coupled to a first portion of the switch in each high voltage switch to "L" and by setting the characterization line coupled to the level shifter in each high voltage switch to "H."

In another embodiment, each of the respective high voltage switches may be turned off to be put in a normal operation mode by setting the enable line coupled to a first portion of the switch in each of the respective high voltage switches to "H" and by setting the characterization line coupled to the level shifter in each of the high voltage switches to "L."

In yet another embodiment, each of the respective high voltage switches may be turned off to be put in a standby mode by setting the enable line coupled to a first portion of the switch in each of the respective high voltage switches to "L" and by setting the characterization line coupled to the level shifter in each of the high voltage switches to "L."

The embodiment or parts of the embodiment described herein can be defined as computer readable code on a computer readable medium. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A high voltage switch for a semiconductor device, comprising:
   a switch defined between a voltage source and a voltage output;
   an enable line coupled to a first transistor of the switch; and
   a level shifter having a characterization line as an input and an output of the level shifter coupled to a second transistor of the switch, the level shifter further having a power rail that is coupled to the switch between the first transistor and the second transistor;
   wherein the high voltage switch is replicated in two or more input/output circuits of a first semiconductor chip and at least one input/output circuit of a second semiconductor chip,
   wherein the first semiconductor chip includes logic for communicating with enable lines and the characterization lines of the high voltage switches of the first and second semiconductor chips to cause the high voltage switches to operate in one of a normal operation mode, a characterization mode, or a standby mode;
   wherein operating in a characterization mode enables communication of a high voltage between the first semiconductor chip and the second semiconductor switch without passing through a core of the first semiconductor chip.

2. The high voltage switch of claim 1, wherein the first transistor of the switch has a source coupled to the voltage source and a drain coupled to the power rail of the level shifter, and the power rail of the level shifter is coupled to a source of the second transistor of the switch, and a drain of the second transistor of the switch is coupled to the voltage output.

3. The high voltage switch of claim 1, wherein the level shifter includes a pair of p-type transistors and a pair of n-type transistors, wherein a source of each of the p-type transistors is coupled to the power rail, and a source of each of the n-type transistors is coupled to ground.

4. The high voltage switch of claim 3, wherein a drain of each of the n-type transistors is cross-coupled to a respective gate of each of the P-type transistors.

5. The high voltage switch of claim 3, wherein the level shifter includes an inverter having an input that is the input of the characterization line and the inverter having an output coupled to a gate of one of the n-type transistors.

6. The high voltage switch of claim 5, wherein the characterization line is additionally coupled to a gate of another of the n-type transistors.

7. The high voltage switch of claim 1, wherein the high voltage switch is part of an input/output circuit of a first semiconductor chip.

8. The high voltage switch of claim 7, wherein the first semiconductor chip is coupled to a second semiconductor chip having at least one high voltage switch.

9. The high voltage switch of claim 1, wherein the second semiconductor chip is interconnected with the first semiconductor chip, the interconnecting of the first semiconductor chip with the second semiconductor chip enables communication of the high voltage from the voltage source of the first semiconductor chip to an input pad of a second semiconductor chip, wherein identification of which one of a plurality of input pads the communication of the high voltage is directed to is set by programming logic that accesses selected enables lines and selected characterization lines of the high voltage switches, and wherein the first transistor and the second transistor of the switch are p-type transistors.

10. The high voltage switch of claim 1, wherein the voltage output of the high voltage switch is floating when operating in either the normal operation mode or the standby mode.

11. The high voltage switch of claim 1, wherein the voltage output of the high voltage switch is about equal to the voltage source that is capable of operating in a voltage range that is higher than normal operation voltages of the first semiconductor chip.

12. A system, comprising:
   (a) a controller chip having core logic and two or more high voltage switches integrated at input/output circuits of the controller chip, each high voltage switch including,
      (i) a switch defined between a voltage source and a voltage output;
      (ii) an enable line coupled to a first transistor of the switch; and
      (iii) a level shifter having a characterization line as an input and an output of the level shifter coupled to a second transistor of the switch, the level shifter further having a power rail that is coupled to the switch between the first transistor and the second transistor;
   (b) a plurality of memory chips, each memory chip having a high voltage switch integrated at an input/output circuit of the respective memory chip;

(c) an interface board; and
(d) interconnection lines defined between the input/output circuits of the controller chip and the interface board and the between the input/output circuits of the memory chips and the interface board, wherein core logic of the controller chip communicates with enable lines and the characterization lines of the high voltage switches of the controller chip and memory chips to cause select high voltage switches to operate in a characterization mode to enable communication of a high voltage between the controller chip and one or more of the memory chips, without passing the high voltage through the core logic of the controller chip.

13. The system of claim 12, wherein the level shifter is further defined, such that the first transistor of the switch has a source coupled to the voltage source and a drain coupled to the power rail of the level shifter, and the power rail of the level shifter is coupled to a source of the second transistor of the switch, and a drain of the second transistor of the switch is coupled to the voltage output, and the level shifter includes a pair of p-type transistors and a pair of n-type transistors, wherein a source of each of the p-type transistors is coupled to the power rail, and a source of each of the n-type transistors is coupled to ground, and a drain of each of the n-type transistors is cross-coupled to a respective gate of each of the P-type transistors, such that the level shifter includes an inverter having an input that is the input of the characterization line and the inverter having an output coupled to a gate of one of the n-type transistors, the characterization line is additionally coupled to a gate of another of the n-type transistors.

* * * * *